(12) United States Patent
Filipovic

(10) Patent No.: US 8,059,758 B2
(45) Date of Patent: Nov. 15, 2011

(54) CONVERSION OF MULTIPLE ANALOG SIGNALS IN AN ANALOG TO DIGITAL CONVERTER

(75) Inventor: Daniel F. Filipovic, Solana Beach, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 993 days.

(21) Appl. No.: 11/352,495

(22) Filed: Feb. 10, 2006

(65) Prior Publication Data

US 2007/0189419 A1  Aug. 16, 2007

(51) Int. Cl.
*H04L 27/00* (2006.01)
(52) U.S. Cl. .......................................... 375/324
(58) Field of Classification Search .................. 375/259, 375/316, 324; 379/387.02; 324/607; 341/126, 341/127, 128, 155, 156, 159
See application file for complete search history.

(56) References Cited

U.S. PATENT DOCUMENTS

| | | | |
|---|---|---|---|
| 4,442,433 A | 4/1984 | Myers et al. | |
| 5,459,432 A | 10/1995 | White et al. | |
| 5,825,756 A * | 10/1998 | Hattori ......................... | 370/319 |
| 6,005,887 A | 12/1999 | Bottomley et al. | |
| 6,125,272 A | 9/2000 | Bautista et al. | |
| 6,490,326 B1 | 12/2002 | Bastani et al. | |
| 6,502,184 B1 | 12/2002 | Zhang et al. | |
| 6,574,459 B1 | 6/2003 | Kaminski et al. | |
| 6,683,919 B1 * | 1/2004 | Olgaard et al. ............... | 375/316 |
| 6,931,241 B2 | 8/2005 | Khlat et al. | |
| 6,933,766 B2 | 8/2005 | Khlat et al. | |
| 6,959,179 B1 | 10/2005 | Wong et al. | |
| 6,978,358 B2 | 12/2005 | Francis | |
| 7,236,763 B2 | 6/2007 | Heck | |
| 7,251,468 B2 | 7/2007 | Ruelke et al. | |
| 7,356,324 B2 | 4/2008 | Hammes et al. | |
| 2002/0051497 A1 | 5/2002 | Breems et al. | |
| 2002/0098820 A1 | 7/2002 | Dijkmans et al. | |
| 2003/0174090 A1 * | 9/2003 | Spilker et al. ................. | 342/386 |

(Continued)

FOREIGN PATENT DOCUMENTS

DE  4003301  8/1991

(Continued)

OTHER PUBLICATIONS

International Search Report and Written Opinion, PCT/US2007/061953—International Search Authority—European Patent Office—Jun. 26, 2007.

(Continued)

*Primary Examiner* — Sam K Ahn
(74) *Attorney, Agent, or Firm* — William M. Hooks

(57) ABSTRACT

A multiple analog signal converter (100) simultaneously converts multiple analog signals (104,106) to digital signals (112, 114) using a single analog to digital converter (ADC) 102. A first analog signal (104) at a first center frequency and a second analog signal (106) at a second center frequency are processed by the ADC (102) to generate a composite digital signal (110) comprising a first digital signal (112) corresponding to the first analog signal (104) and a second digital signal (114) corresponding to the second analog signal (106). The composite digital signal (110) is digitally frequency shifted to recover the second digital signal (106). The first digital signal (104) is recovered by digitally filtering the composite digital signal (110). In some circumstances, a first radio frequency (RF) signal (118) and a second RF signal (122) are frequency shifted to generate the first analog signal (104) and second analog signal (106).

17 Claims, 6 Drawing Sheets

U.S. PATENT DOCUMENTS

| | | | |
|---|---|---|---|
| 2004/0158678 A1 | 8/2004 | Chen | |
| 2004/0177233 A1 | 9/2004 | Kubiczek et al. | |
| 2005/0059364 A1* | 3/2005 | Hansen et al. | 455/127.4 |
| 2005/0094750 A1* | 5/2005 | Park et al. | 375/343 |
| 2005/0195920 A1* | 9/2005 | Gierl et al. | 375/316 |
| 2005/0265485 A1 | 12/2005 | Robinson | |
| 2006/0068745 A1* | 3/2006 | Wei | 455/323 |
| 2007/0093227 A1* | 4/2007 | Lieback et al. | 455/276.1 |

FOREIGN PATENT DOCUMENTS

| | | |
|---|---|---|
| DE | 100 42 959 C1 | 1/2002 |
| EP | 1111772 A1 | 6/2001 |
| EP | 1 154 589 A2 | 11/2001 |
| EP | 1199796 A1 | 4/2002 |
| GB | 2 338 853 A | 12/1999 |
| JP | 2001274714 A | 10/2001 |
| JP | 2001358630 A | 12/2001 |
| JP | 2005260720 A | 9/2005 |
| WO | WO2005050940 * | 6/2005 |

OTHER PUBLICATIONS

Translation of Office Action in Japanese application 2008-554532 corresponding to U.S. Appl. No. 11/352,495, citing JP2005260720, JP2001274714 and JP2001358630 dated Feb. 1, 2011.

* cited by examiner

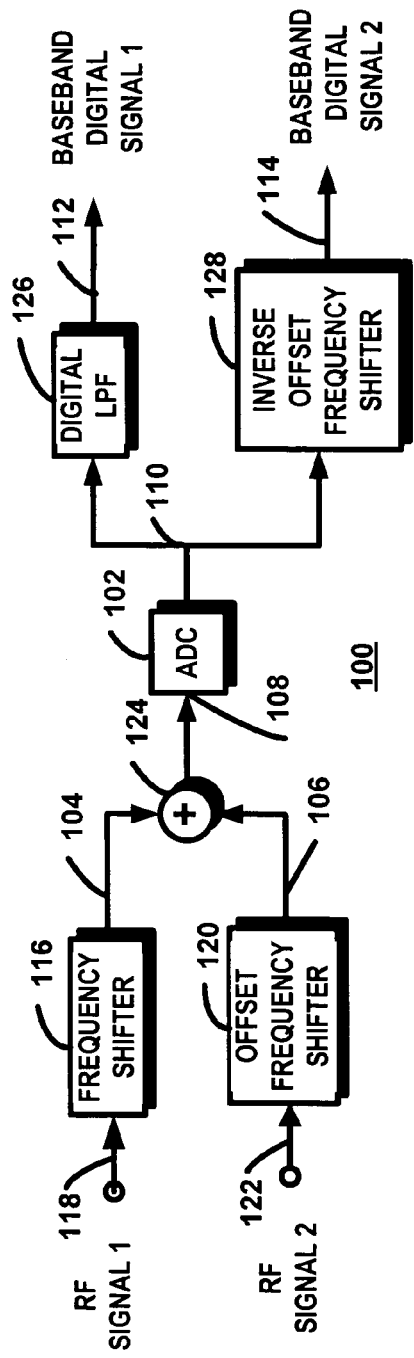
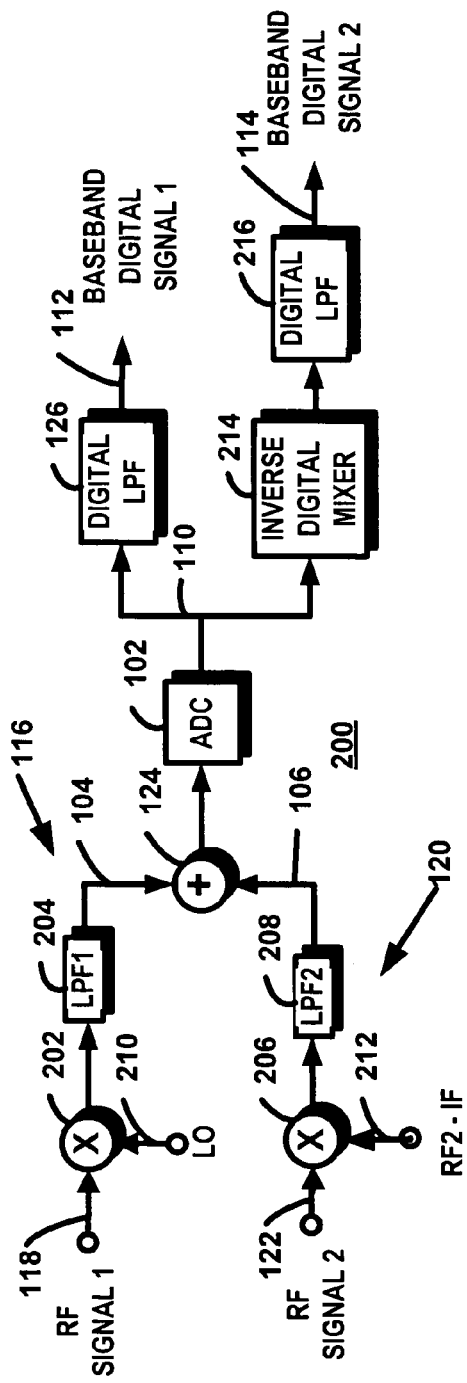

CONVERSION OF MULTIPLE ANALOG SIGNALS IN AN ANALOG TO DIGITAL CONVERTER

BACKGROUND

1. Field

The invention relates in general to analog to digital conversion and more specifically to an apparatus, system, and method for processing multiple signals in an analog to digital converter.

2. Background

Analog to digital converters (ADCs) are often used in receivers to convert an analog signal to a digital representation. The analog signal is sampled to produce a series of samples represented by numerical values. In conventional systems utilizing ADCs, a single ADC is used to convert each analog signal to a digital signal. The size and cost of conventional devices increases as the number of analog signals that must be simultaneously converted increases.

Accordingly, there is a need for an apparatus and system for simultaneously converting multiple analog signals to digital signals using a single ADC.

BRIEF DESCRIPTION OF THE DRAWINGS

FIG. 1 is a block diagram of a multiple signal converter using an analog to digital converter (ADC) in accordance with the exemplary embodiments of the invention.

FIG. 2 is a block diagram of a multiple signal converter in accordance with a first exemplary embodiment.

DETAILED DESCRIPTION

Figure 3:
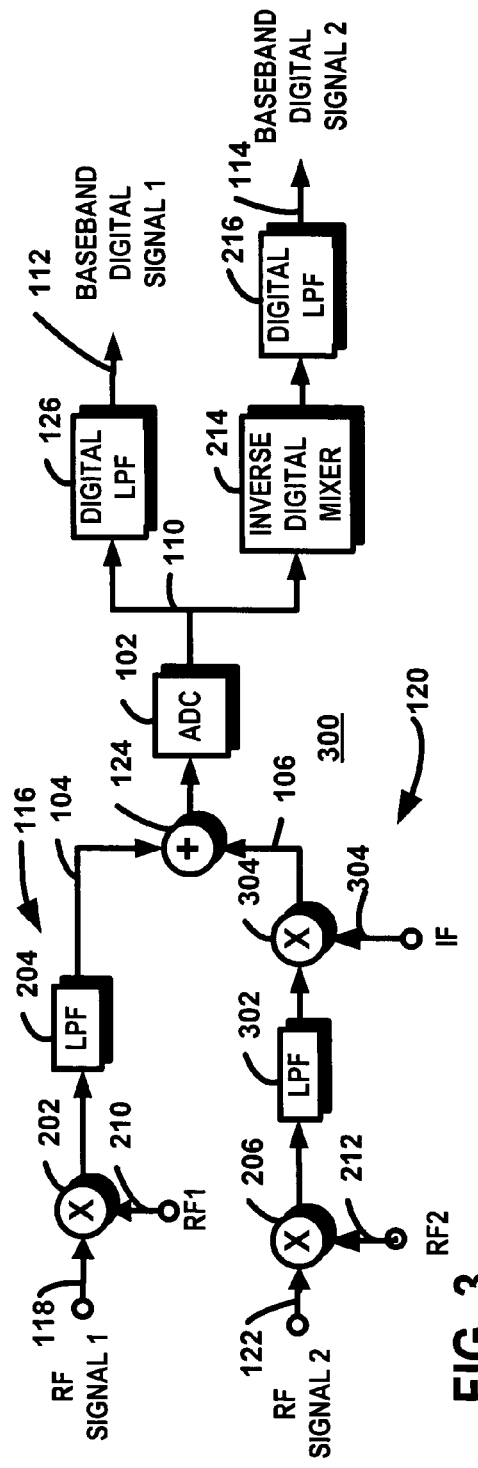
FIG. 3 is a block diagram of a multiple signal converter in accordance with a second exemplary embodiment.

A multiple analog signal converter simultaneously converts multiple analog signals to digital signals using a single analog to digital converter (ADC). A first analog signal at a first center frequency and a second analog signal at a second center frequency are processed by a ADC to generate a composite digital signal comprising a first digital signal corresponding to the first analog signal and a second digital signal corresponding to the second analog signal. The composite digital signal is digitally frequency shifted to recover the second digital signal. The first digital signal is recovered by digitally filtering the composite digital signal. In the exemplary embodiments, a first radio frequency (RF) signal and a second RF signal are frequency shifted to generate the first analog signal and second analog signal.

FIG. 1 is a block diagram of a multiple signal converter 100 using an analog to digital converter (ADC) 102 in accordance with the exemplary embodiments of the invention. Although FIG. 1 shows two signals 104, 106 that are received at the ADC 102, the principles discussed below may be applied to any number of signals. The various functions and operations of the blocks described with reference to the multiple signal converter 100 may be implemented in any number of devices, circuits, or elements. Two or more of the fractional blocks may be integrated in a single device and the functions described as performed in any single device may be implemented over several devices in some circumstances.

A first analog signal 104 at a first center frequency and a second analog signal 106 at a second center frequency are received at an input 108 of the analog to digital converter (ADC) 102. The ADC 102 converts the analog signals to a composite digital signal 110 that includes a first digital signal 112 corresponding to the first analog signal 104 and a second digital signal 114 corresponding to the second analog signal 106. In the exemplary embodiments, a frequency shifter 116 frequency shifts a first radio frequency (RF) signal 118 to shift the first analog signal 104 to a center frequency of zero. Accordingly, the first analog signal 104 in the exemplary embodiments is a baseband signal. An offset frequency shifter 120 frequency shifts a second RF signal 122 to shift the second analog signal 106 to an intermediate frequency (IF) center frequency that is greater than zero. Accordingly, the center frequency of the second analog signal 106 is greater than the center frequency of the first analog signal 104 in the exemplary embodiments. The selection of the IF frequency is based on the bandwidth of the analog signals, the quantization noise response of the ADC 102, and the relative signal strength of the received signals. As discussed below, an analog signal having higher signal strength is shifted to a region in the quantization noise spectrum that has a higher level of noise.

The offset frequency shifter 120 may include multiple signals mixers, filters, and/or signal choppers to shift and filter the second RF signal 122 and generate the second analog signal 106. For example, the second RF signal 122 is mixed to a baseband frequency, low-pass filtered, and mixed up to the intermediate frequency in the second exemplary embodiment as discussed below. In the first exemplar embodiment, the second RF signal is shifted directly to the intermediate frequency by mixing the second RF frequency with a mixing signal that has a value equal to the difference between the frequency of the second RF signal and the second center frequency (RF2-IF). In the third exemplary embodiment, a chopper circuit upsamples the signal to shift the second analog signal. Any number and combination of techniques can be used to shift the RF signals to the corresponding frequencies. Further, the RF signals may be any of numerous types of signals and frequencies. Examples of RF signals 118, 122 include Global Positioning System (GPS) signals and cellular signals such as CDMA signals and Personal Communication Service (PCS) signals. In some circumstances, the analog signals 104, 106 may include the in-phase (I) component and quadrature (Q) component of a quadrature signal.

After the RF signals 118, 122 are frequency shifted and filtered, a signal adder 124 combines the analog signals 104, 106 to be fed into the ADC 102. As explained above, the ADC 102 converts the signals 104, 106 to the composite digital signal 110. In the exemplary embodiments, a digital low pas filter (LPF) 126 digitally filters the composite digital signal 110 to recover the first digital signal 112. Any suitable technique for filtering the digital signal 110 in the digital domain may be used to filter the composite digital signal 110 to produce the first digital signal 112. An inverse offset frequency shifter 128 frequency shifts the composite digital signal 110 in the digital domain to recover the second digital signal 114 at baseband. Accordingly, the inverse offset frequency shifter 128 applies the appropriate digital processing to shift the second digital signal 114 from the second center frequency (IF) to baseband.

FIG. 2 is a block diagram of a multiple signal converter 200 in accordance with a first exemplary embodiment. As explained above, two RF signals 118, 122 containing analog signals are frequency shifted to two different center frequencies, combined, and processed by the ADC 102. The resulting composite digital signal 110 is digitally processed to recover the two digital signals 112, 114 corresponding to the analog signals 104, 106. In the first exemplary embodiment, the frequency shifter 116 includes a signal mixer 202 and a low pass filter (LPF1) 204 and the offset frequency shifter 120 includes a signal mixer 206 and low pass filter (LPF2) 208. The first RF signal 118 is mixed with mixing signal 210 having a frequency (LO frequency) that is the same as the carrier frequency (RF1) of the first RF signal 118. Accordingly, the signal mixer 202 mixes the first analog signal 104 down to baseband. The first low pass filter (LPF1) 204 filters the signal to remove any high frequency images as well as any high frequency noise. The second RF signal 122 is mixed with a second mixing frequency 212 having a frequency that results in shifting the second analog signal to the second center frequency. The frequency of the second mixing signal 212 is equal to RF2-IF, where RF2 is the carrier frequency of the second RF signal and IF is the second center frequency that is greater than zero. Accordingly, the output of the second signal mixer 206 is the second analog signal 106 having a center frequency equal to the IF. A second low pass filter (LPF2) 208 removes any high frequency images and minimizes noise above the second analog signal 106. Examples of suitable low pass filters include single pole analog low pass filters. The signals 104, 106 are combined by the adder 124 and processed by the ADC 108. The composite digital signal 110 is digitally low pass filtered to recover the first digital signal 112. In the first exemplary embodiment, an inverse digital mixer 214 mixes the composite digital signal 110 in the digital domain to shift the digital signal to baseband. Another digital low pass filters 216 filters the resulting shifted signal to recover the second digital signal 114. Therefore, a single ADC 102 is used to simultaneously convert multiple analog signals 104, 106 to digital signals 112, 114.

FIG. 3 is a block diagram of a multiple signal converter 300 in accordance with a second exemplary embodiment. In the second exemplary embodiment, the offset frequency shifter 120 includes a baseband signal mixer 206, a low pass filter 304 and an IF signal mixer 306. The second RF signal 122 is mixed with a mixing signal 210 equal to the frequency of the second RF signal 116 (RF2) to place the second analog signal at baseband. The low pass filter 304 minimizes high frequency components and other noise before the IF signal mixer 306 mixes the baseband signal to the second center frequency (IF). As explained above, the selection of the IF frequency may be based on the bandwidth of the analog signals 104, 106, the quantization noise response of the ADC 102 and the signal strength of the received signals. The second analog signal 106 at the second center frequency (IF) is combined with the first analog signal 104 at baseband and processed as described above with reference to the first exemplary embodiment.

Figure 4:
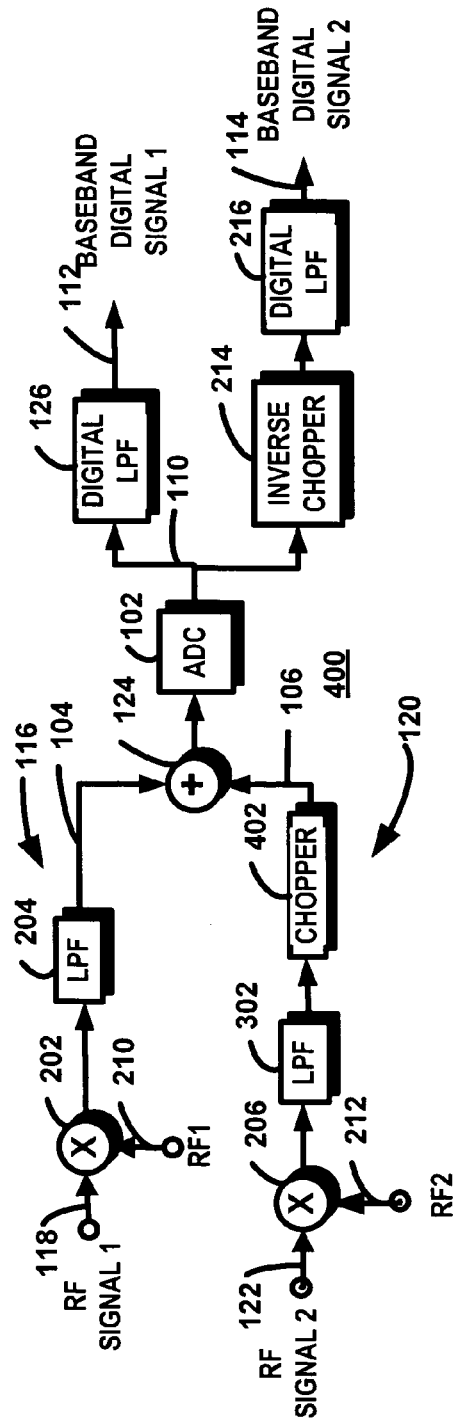
FIG. 4 is a block diagram of a multiple signal converter in accordance with a third exemplary embodiment.

FIG. 4 is a block diagram of a multiple signal converter 400 in accordance with a third exemplary embodiment. The second RF signal 122 is mixed to baseband and filtered as described with reference to second exemplary embodiment. A chopper 402 shifts the baseband signal to the IF center frequency (second center frequency). Using an upsampling technique, the chopper 402 creates multiple images of the baseband signal centered at higher frequencies. An example of a suitable chopper 402 is a circuit that multiples the baseband analog signal by inverting alternating sections of the analog signal at a selected period. For example a series such as [1 1 1 1 −1 −1 −1 −1] can be applied to the baseband signal. An example of a resulting spectrum is discussed with reference to FIG. 5. After combining in the adder 124 and processing in the ADC 102, the signal is received at an inverse chopper 214 that applies an inverse chopping technique to recover the second digital signal at the IF center frequency (second center frequency). The digital LPF 216 filters the composite digital signal 110 in the digital domain to remove undesired higher frequency components and noise. The first RF signal 118 and the first analog signal 104 are processed as discussed above.

Figure 5:
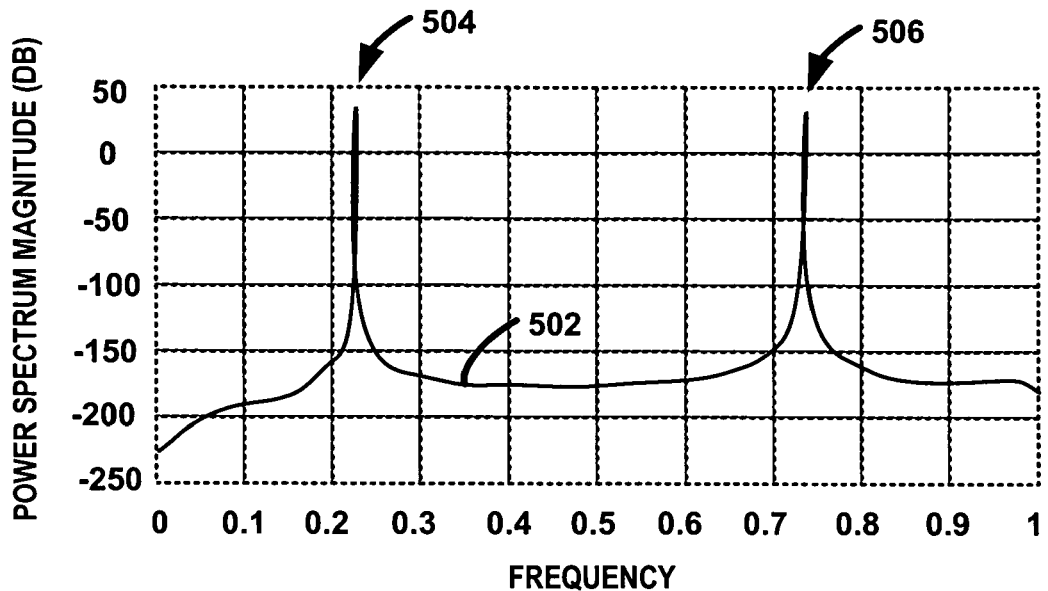
FIG. 5 is a graphical illustration of a frequency spectrum of an upsampled signal in accordance with the third exemplary embodiment.

FIG. 5 is a graphical illustration of a frequency spectrum of an upsampled signal in accordance with the third exemplary embodiment. The exemplary power spectrum curve 502 in FIG. 5 is a magnitude in dB of a normalized upsampled signal where 1 is equal to half of the sampling frequency. [Therefore, multiplying the x-axis by twice the sampling frequency provides the actual frequency in Hertz (Hz)]. The first image 504 is a frequency shifted signal above baseband. The second image 506 is a repeating signal above baseband where the period of the copper is inversely related to the frequencies of the images 504, 506. Accordingly, increasing the period lowers the frequency. In the example where the period is [1 -1], the first image 504 is positioned at 1.0. The first image of the analog signal appears at approximately a normalized frequency of 0.25 in the exemplary illustration of FIG. 5.

Figure 6:
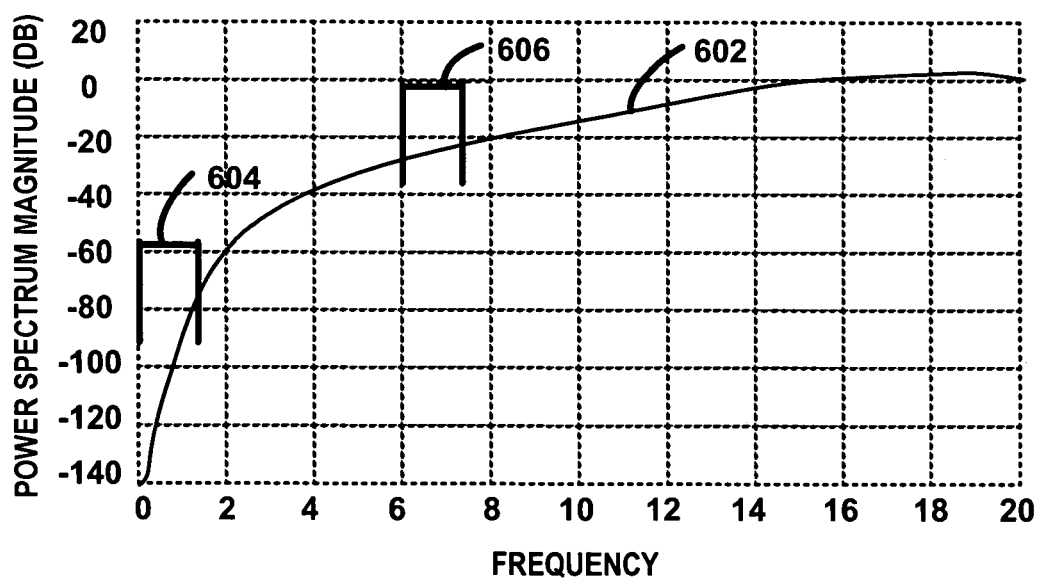
FIG. 6 is a graphical illustration of an exemplary quantization noise spectrum of the ADC.

FIG. 6 is a graphical illustration of an exemplary quantization noise spectrum 602 of the ADC 102. The curve 602 in FIG. 6 does not necessarily represent an actual quantization noise spectrum of an ADC 102 and is not necessarily to scale. The ADC 102 in the exemplary embodiments has a quantization noise spectrum 602 that increases with frequency. An example of an ADC 102 with such characteristics is a sigma-delta analog to digital converter where oversampling increases the dynamic range at lower frequencies by decreasing the quantization noise. A first signal region 604 bounds the expected frequency range and signal magnitude of the first analog signal 104. The second signal region 606 bounds the expected frequency range and signal magnitude of the second analog signal 106 at the IF center frequency. By selecting the appropriate IF center frequency, the second analog signal is placed in a region 606 within the spectrum where the quantization noise is sufficiently low to process the second analog signal but which allows both analog signals 104, 106 to be processed with minimal interference. Accordingly, the ADC 102 is utilized to convert multiple analog signals into a composite digital signal 110 that is further processed to recover the digital representations of the analog baseband signals. The exemplary regions 606, 604 in FIG. 6 represent typical regions for GPS signal and CDMA cellular signal. Those skilled in the art will readily apply the examples in FIG. 6 to other types of signals and ADCs.

Figure 7:
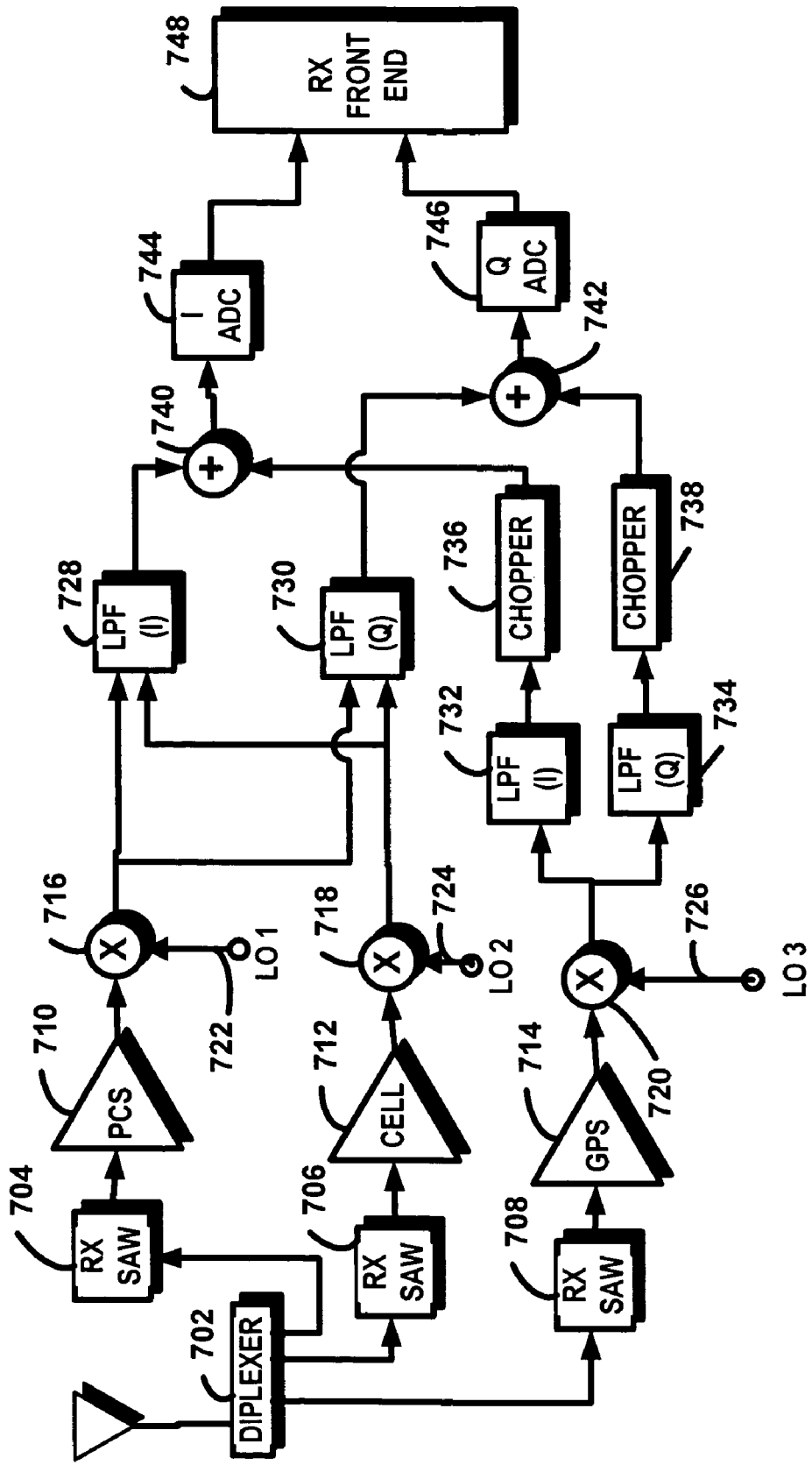
FIG. 7 is a block diagram of receiver circuit suitable for utilizing the multiple signal converter.

FIG. 7 is a block diagram of receiver circuit 700 suitable for utilizing the multiple signal converter 400. The various functions and operations of the blocks described with reference to the receiver circuit 700 may be implemented in any number of devices, circuits, or elements. Two or more of the functional blocks may be integrated in a single device and the functions described as performed in any single device may be implemented over several devices in some circumstances. Further, the circuit 700 may include any number of additional devices as recognized by those skilled in the art but not illustrated in FIG. 7 in the interest of brevity.

The receiver circuit 700 may be implemented as part of a mobile communication device such as cellular telephone or wireless personal digital assistant (PDA), for example. The exemplary receiver 700 receives signals from three communication systems including a CDMA cellular system, a PCS system and a GPS system. Signals are received through an antenna and distributed by a diplexer 702 to receiver chains corresponding to the different communication systems. Each receiver chain includes a Surface Acoustic Wave (SAW) filter 704, 706, 708 that band limits the desired received signal and reduces the received energy outside of the particular frequency band before the signal is amplified by a low noise amplifier (LNA) 710, 712, 714. The amplified signals may be further filtered in some circumstances.

Each of the receiver chains includes a signal mixer 716, 718, 720 that mixes a mixing signal 722, 724, 726 with the incoming RF signal. The frequency of the mixing signals (LO1, LO2, and LO3) 722, 724, 726 are selected to shift the RF signals to baseband. A PCS signal mixer 716 mixes the amplified and filtered PCS signal with a mixing signal 722 to shift the PCS signal to baseband. A cellular signal mixer 718 mixes the amplified and filtered cellular signal with another mixing signal 724 to shift the cellular signal to baseband. A GPS signal mixer 720 mixes the amplified and filtered GPS signal with a third mixing signal 726 to shift the GPS signal to baseband. The signal mixers 716, 718 720 are quadrature mixers that produce an in-phase (I) component and a quadrature (Q) component that has a 90 degree phase offset from the I component.

The I component of the PCS signal and the I component of the cellular signal are passed through a low pass filter 728 and the Q components of the cellular and PCS signals are passed through another low pass filter 730. The I component of the GPS signal is filtered by a low pas filter 732 before a chopper upshifts the filtered signal to an intermediate frequency (IF). Another low pass filter 734 filters the Q component of the GPS signal before another shopper 738 upshifts the Q component to the IF.

The receiver circuit 700 is configured to receive GPS signals simultaneously with either PCS signals or cellular signals. The exemplary receiver circuit 700, however, does not simultaneously receive cellular signals and PCS signals. The GPS I component and either the cellular I component or the PCS I component are combined in the adder 740 and converted in the ADC 744 to form a composite digital I signal. The GPS Q component and either the cellular Q component or the PCS Q component are combined in another adder 742 and converted in another ADC 746 to form a composite digital Q signal.

The receiver front end 748 processes each of the composite digital signals as discussed above to recover a GPS digital I component signal and a GPS digital Q component signal. The each of the GPS signal components is frequency shifted to a signal region 606 above the baseband region 604 allowing both the GPS and a cellular (or PCS) signal to be processed simultaneously by a single ADC. Due to the higher signal level of the GPS signal, the GPS signal can be positioned within a region 606 of the ADCs quantization noise spectrum that has a higher noise than the baseband region 604. Accordingly, additional ADCs for the GPS signal are not required.

Figure 8:
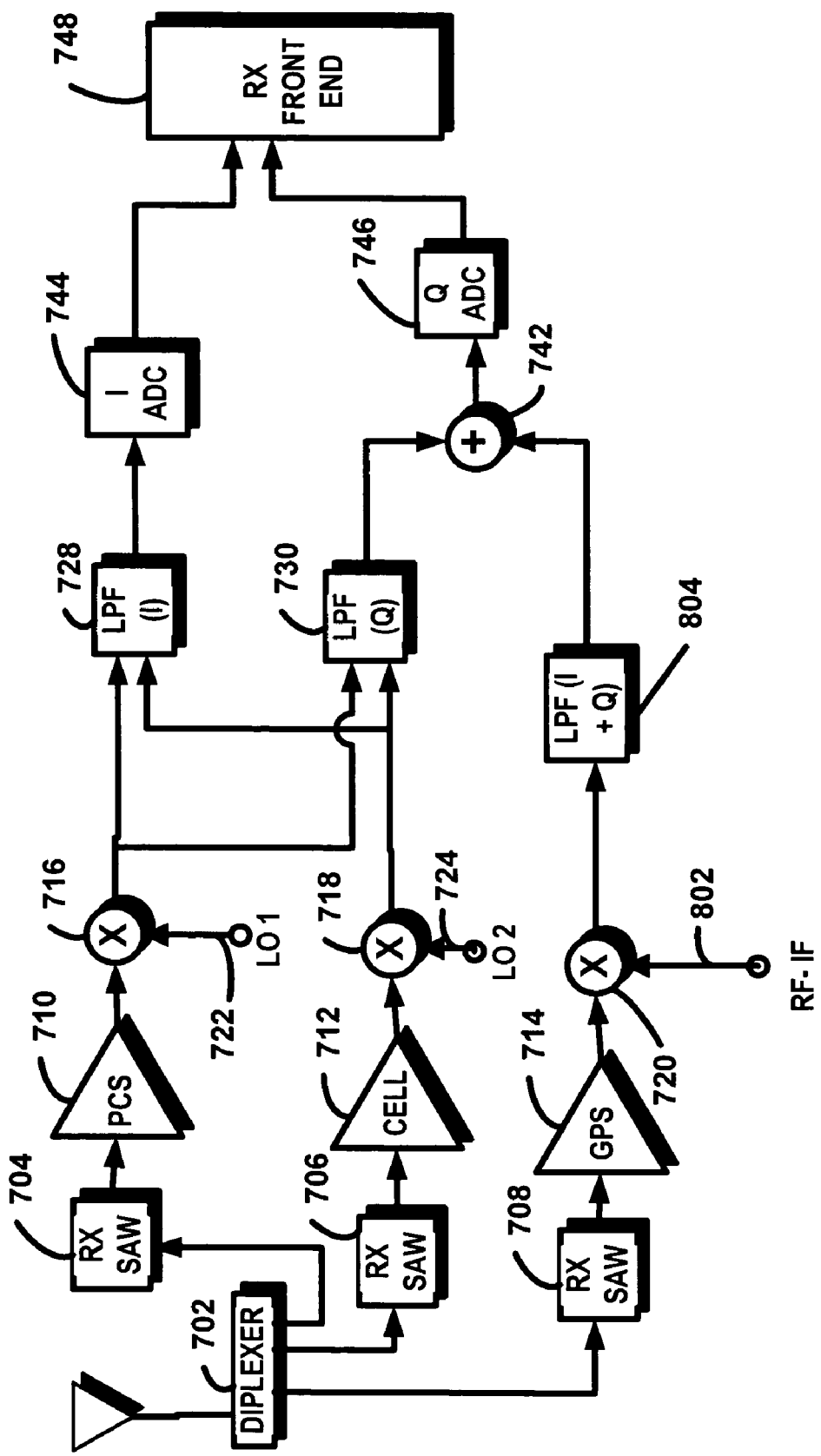
FIG. 8 is a block diagram of receiver circuit suitable for utilizing the multiple signal converter.

FIG. 8 is a block diagram of receiver circuit 800 suitable for utilizing the multiple signal converter 200. In the exemplary receiver circuit 800, the GPS signal is frequency shifted to an IF frequency before being combined with the Q component signal of the cellular signal or the PCS signal. After filtering and amplification by the SAW filter 708 and the GPS LNA 714, the GPS RF signal is frequency shifted to the IF. The GPS signal mixer 720 shifts the GPS signal by mixing the signal with a mixing signal 802 equal to the center frequency (RF) of the GPS signal minus the IF frequency. A low pass filter 804 reduces higher frequency components and noise before the GPS signal at the IF is combined with the Q component of the PCS or cellular signal is the adder 742. In some circumstances a band pass filter may be used for the low pass filter 804. Since the GPS signal is not shifted to baseband, both the I component and the Q component are present in the GPS IF signal. The receiver front end 748 processes the signal as described above with reference to FIG. 2 to receiver the GPS digital signal.

Figure 9:
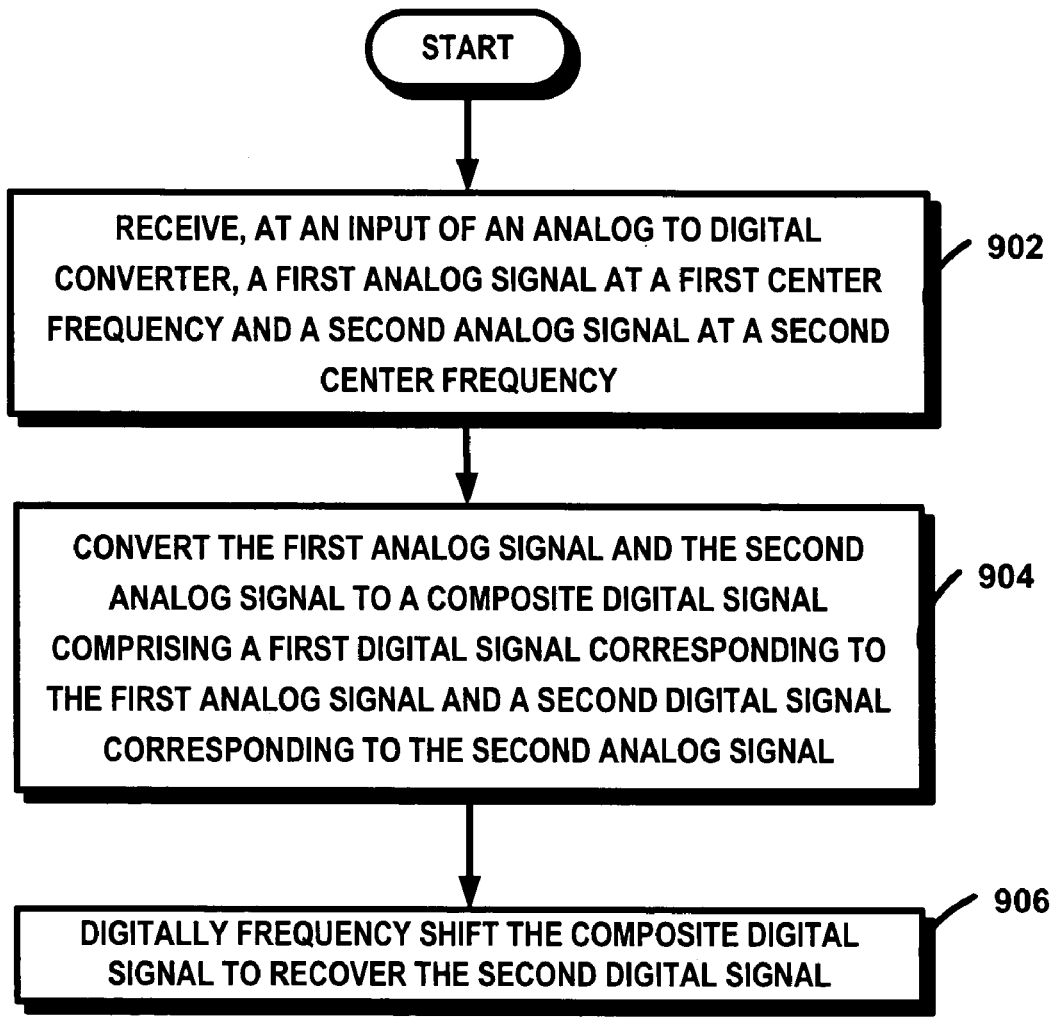
FIG. 9 is a flow chart of a method of converting multiple analog signals to digital signals in accordance with the exemplary embodiments of the invention.

FIG. 9 is a flow chart of a method of converting multiple analog signals to digital signals. Although the method may be performed in any number of hardware and software configurations, the exemplary method is discussed with reference to the exemplary multiple signal converters 100, 200, 300, 400.

At step 902, a first analog signals and a second analog signal are received at an input of the ADC 102. The first analog signal 104 has a first center frequency and the second analog signal 106 has a second center frequency. In the exemplary embodiments, a first RF signal 118 is frequency shifted to the first center frequency and a second RF signal 122 is frequency shifted to the second center frequency, where the first center frequency is zero and the second center frequency is an IF frequency greater than zero.

At step 904, the analog signals 104, are converted into a composite digital signal 110 that comprises a first digital signal corresponding to the first analog signal 104 and a second digital signal corresponding to the second analog signal 106.

At step 906, the composite digital signal is digitally frequency shifted to recover the second digital signal 114 as baseband. In the exemplary embodiments, the composite signal is further processed by digitally filtering the frequency shifted signal. The composite digital signal 110 may be frequency shifted by inverse digital mixing or by inverse chopping. In the exemplary embodiments, the first digital signal is recovered by digitally filtering the composite digital signal 110.

Therefore, in the exemplary embodiments, a single ADC 102 converts multiple analog signals 104, 106. The analog signals 104, 106 have different center frequencies allowing both signals to be converted simultaneously. Digital filtering and frequency shifting receiver the digital signals 112, 114 corresponding to the analog signals 104, 106.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

What is claimed is:

1. A multiple signal converter comprising:
   a frequency shifter configured to frequency shift a first radio frequency signal to a baseband frequency to generate a first analog signal;
   an offset frequency shifter configured to frequency shift a second radio frequency signal to a second center frequency to generate a second analog signal;
   a combiner configured to combine the first analog signal with the second analog signal;
   an analog to digital converter coupled to the combiner and configured to convert the first analog signal at the baseband frequency and the second analog signal at the second center frequency to a composite digital signal comprising a first digital signal corresponding to the first analog signal and a second digital signal corresponding to the second analog signal; and
   a digital frequency shifter configured to digitally frequency shift the composite digital signal to recover the second digital signal,
   wherein the second center frequency is selected based in part on a quantization noise spectrum of the analog to digital converter.

2. The multiple signal converter in accordance with claim 1, wherein the offset frequency shifter comprises:
   a signal mixer configured to mix the second radio frequency signal with a mixing signal to shift the second radio frequency signal to the second center frequency.

3. The multiple signal converter in accordance with claim 1, wherein the offset frequency shifter comprises:
   a first signal mixer configured to mix the second radio frequency signal with a first mixing signal to shift the second radio frequency signal to baseband; and
   a second signal mixer configured to mix the baseband second radio frequency signal with a second mixing signal to shift the baseband second radio frequency signal to the second center frequency.

4. The multiple signal converter in accordance with claim 1, wherein the offset frequency shifter comprises:
   a signal mixer configured to mix the second radio frequency signal with a mixing signal to shift the second radio frequency signal to baseband; and
   a chopper configured to upsample the baseband second radio frequency signal to shift the baseband second radio frequency signal to the second center frequency.

5. The multiple signal converter in accordance with claim 4, wherein the digital frequency shifter comprises an inverse chopper.

6. The multiple signal converter in accordance with claim 1, wherein the digital frequency shifter comprises an inverse digital mixer.

7. The multiple signal converter in accordance with claim 1, wherein the digital frequency shifter comprises an inverse chopper.

8. The multiple signal converter in accordance with claim 1, further comprising:
   a digital filter configured to filter a digitally frequency shifted signal produced by the digital frequency shifter to recover the second digital signal.

9. The multiple signal converter in accordance with claim 1, further comprising:
   a digital filter configured to filter the composite digital signal to recover the first digital signal.

10. The multiple signal converter in accordance with claim 1, wherein the first radio frequency signal is a cellular signal and the second radio frequency signal is a Global Positioning System (GPS) signal.

11. The multiple signal converter in accordance with claim 1, wherein the quantization noise spectrum of the analog to digital converter has a first noise level less at the baseband frequency less than a second noise level at the second center frequency.

12. The multiple signal converter in accordance with claim 11, wherein the analog to digital converter is a sigma delta analog to digital converter.

13. A multiple signal converter comprising:
   a first frequency shifting means for frequency shifting a first analog signal of a first radio frequency signal to a baseband frequency;
   a second frequency shifting means for frequency shifting a second analog signal of a second radio frequency signal to a second center frequency;
   a conversion means for converting the first analog signal and the second analog signal to a composite digital signal;

a digital frequency shifting means for digitally frequency shifting second center frequency of the composite digital signal to baseband;

a first digital low-pass filtering means for digitally low-pass filtering the composite digital signal to recover the first digital signal; and a second digital low-pass filtering means for digitally low-pass filtering the digitally frequency shifted composite digital signal to recover the second digital signal.

14. A method comprising:

receiving, at an input of an analog to digital converter, a first analog signal at a baseband frequency;

receiving, at the input, a second analog signal at a second center frequency;

adding the first analog signal to the second analog signal to generate a combined analog signal;

converting the combined analog signal to a composite digital signal comprising a first digital signal corresponding to the first analog signal and a second digital signal corresponding to the second analog signal;

digitally filtering the composite digital signal to recover the first digital signal;

digitally frequency shifting the composite digital signal to recover the second digital signal;

wherein digitally filtering the composite signal comprises digitally low pass filtering the composite digital signal to recover the first digital signal; and wherein digitally frequency shifting the composite digital signal comprises digitally shifting the second digital signal to baseband and digitally filtering a frequency shifted digital signal resulting from the digitally frequency shifting to recover the second digital signal.

15. The method in accordance with claim 14, further comprising:

frequency shifting a first radio frequency signal to generate the first analog signal; and frequency shifting a second radio frequency signal to generate the second analog signal.

16. The method in accordance with claim 14, wherein a first quantization noise of the analog to digital converter at the baseband frequency is less than a second quantization noise of the analog to digital converter at the second center frequency.

17. The method in accordance with claim 15, wherein frequency shifting the second radio frequency signal comprises:

frequency shifting the second radio signal to generate an analog baseband second signal;

filtering the analog baseband second signal; and frequency shifting the analog baseband second signal to the second center frequency.

* * * * *